(12) United States Patent
Choi et al.

(10) Patent No.: US 9,105,684 B2
(45) Date of Patent: Aug. 11, 2015

(54) ISOLATION STRUCTURE, SEMICONDUCTOR DEVICE HAVING THE SAME, AND METHOD FOR FABRICATING THE ISOLATION STRUCTURE

(75) Inventors: Hyung-suk Choi, Cheongju-si (KR); Hyun-tae Jung, Cheongju-si (KR); Eung-ryul Park, Cheongju-si (KR); Da-soon Lee, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 399 days.

(21) Appl. No.: 13/465,593

(22) Filed: May 7, 2012

(65) Prior Publication Data

US 2013/0075857 A1    Mar. 28, 2013

(30) Foreign Application Priority Data

Sep. 26, 2011  (KR) .................. 10-2011-0097161

(51) Int. Cl.
  *H01L 29/06* (2006.01)
  *H01L 21/762* (2006.01)
  *H01L 21/761* (2006.01)

(52) U.S. Cl.
  CPC ........ *H01L 21/76224* (2013.01); *H01L 21/761* (2013.01)

(58) Field of Classification Search
  USPC ......................................... 438/435
  See application file for complete search history.

(56) References Cited

U.S. PATENT DOCUMENTS

| | | |
|---|---|---|
| 5,789,769 A | 8/1998 | Yamazaki |
| 5,966,598 A | 10/1999 | Yamazaki |
| 2002/0167067 A1* | 11/2002 | Kim .............................. 257/506 |
| 2009/0004817 A1* | 1/2009 | Kim et al. ...................... 438/435 |
| 2011/0062547 A1 | 3/2011 | Onishi et al. |

* cited by examiner

*Primary Examiner* — Matthew W Such
*Assistant Examiner* — Robert Carpenter
(74) *Attorney, Agent, or Firm* — NSIP Law

(57) ABSTRACT

An isolation structure of a semiconductor, a semiconductor device having the same, and a method for fabricating the isolation structure are provided. An isolation structure of a semiconductor device may include a trench formed in a substrate, an oxide layer formed on a bottom surface and an inner sidewall of the trench, a filler formed on the oxide layer to fill a part of inside of the trench, and a fourth oxide layer filling an upper portion of the filler of the trench to a height above an upper surface of the trench, an undercut structure being formed on a boundary area between the inner sidewall and the oxide layer.

23 Claims, 15 Drawing Sheets

Electron microscope Image of Defects & Dislocation

ISOLATION STRUCTURE, SEMICONDUCTOR DEVICE HAVING THE SAME, AND METHOD FOR FABRICATING THE ISOLATION STRUCTURE

CROSS-REFERENCE TO RELATED APPLICATIONS

This application claims the benefit under 35 U.S.C. §119 (a) of Korean Patent Application No. 10-2011-0097161, filed on Sep. 26, 2011, in the Korean Intellectual Property Office, the entire disclosure of which is incorporated herein by reference for all purposes.

BACKGROUND

1. Field

The following description relates to an isolation structure, a semiconductor with an isolation structure, a method for fabricating an isolation structure, and for example, to an isolation structure of a semiconductor device containing a deep trench isolation (DTI) structure, and a fabrication method thereof.

2. Description of the Related Art

Along with the recent advancement in electronic engineering, demands for compact-sized multi-functional electronic apparatuses have greatly increased. A system on chip (SoC) is one of the technologies that were developed to meet such increasing demands. The SoC technology refers to implementing a system that integrates a plurality of devices into a single chip.

Due to the recent development and introduction of Micro-Electro-Mechanical Systems (MEMS) or Nano-Electro-Mechanical Systems (NEMS) technology, the attempts to implement various devices on a single chip have increased.

However, one problem posed by such technologies is that the possibility of having interference between two or more devices increases when a plurality of devices is integrated on one substrate. For example, when electric interference is generated, the electric interference may affect the operation of other devices on the substrate, possibly causing various malfunctions in the devices.

In order to prevent the above-mentioned problems, conventionally, a device isolation structure that electrically isolates the devices on a substrate is fabricated.

Trench isolation is a common technique for forming a device isolation structure. In trench isolation technique, a trench is formed to a predetermined depth of a silicon substrate, an oxide layer is buried in the trench, and by chemical mechanical polishing, unnecessary portion of the oxide layer is removed, leaving a device isolation structure within the silicon substrate.

However, the conventional trench isolation method has a shortcoming. That is, in forming a deep trench using polishing process, etch damage is done to the semiconductor substrate and defect areas are also formed on the surface of the substrate. These damages or defects cause a leakage of electric current between the devices within the semiconductor.

FIG. 1 includes electron microscope images obtained in a physical analysis of a semiconductor device fabricated according to a conventional technique. As illustrated in the first microscope image found in FIG. 1, defects are generated on the surface of a substrate of a semiconductor device.

Further, the deep trench isolation (DTI) structure that is formed adjacent to a device receiving high bias exhibits an increase in leak electric current as it is difficult to design the appropriate thickness or processing conditions.

Additionally, the use of a conventional technique for fabricating device isolation involves a high risk of causing physical defects such as voids in the semiconductor device, for example, during the process of filling the interior of a deep trench.

SUMMARY

In one general aspect, there is provided an isolation structure of a semiconductor device, including a trench formed in a substrate, an oxide layer formed on a bottom surface and an inner sidewall of the trench, a filler formed on the oxide layer to fill a part of inside of the trench, and a fourth oxide layer filling an upper portion of the filler of the trench to a height above an upper surface of the trench, an undercut structure being formed on a boundary area between the inner sidewall and the oxide layer.

The general aspect of the isolation structure may further provide that the oxide layer includes a first oxide layer formed in the bottom surface and the inner sidewall of the trench, and a second oxide layer formed on the first oxide layer.

In another general aspect, there is provided an isolation structure of a semiconductor device, including a trench formed in a substrate, a first oxide layer formed in a bottom surface and an inner sidewall of the trench, a nitride layer formed on the first oxide layer, a second oxide layer formed on the nitride layer, a filler formed on the second oxide layer to fill a part of inside of the trench, and a fourth oxide layer filling an upper portion of the filler of the trench to a height above an upper surface of the trench.

The general aspect of the isolation structure may further include an undercut structure formed on a boundary area between the inner sidewall and an oxide layer of the trench.

The general aspect of the isolation structure may further provide that the first and second oxide layers each have a thickness ranging between 2500 and 5000 Å.

The general aspect of the isolation structure may further provide that the trench is a deep trench formed by two etching processes, and the undercut structure is formed on the inner sidewall of the deep trench to a depth that corresponds to the bottom surface of a trench structure formed from one of a plurality of etching processes before the deep trench is formed.

The general aspect of the isolation structure may further provide that the deep trench is formed at a depth of 10 to 40 μm from an upper surface of the substrate, and the undercut structure is formed at a depth of 3 to 7 μm from the upper surface of the substrate.

The general aspect of the isolation structure may further provide that the filler fills to a depth that is lower than an upper surface of the trench by 500 to 3000 Å.

The general aspect of the isolation structure may further include a field oxide layer formed on one side or both sides of the isolation structure by LOCOS.

The general aspect of the isolation structure may further provide that the filler is a polysilicon material.

The general aspect of the isolation structure may further provide that the first and second oxide layers each have 65 to 75% of coverage.

The general aspect of the isolation structure may further include a nitride layer formed on a boundary area between the trench and the first oxide layer.

The general aspect of the isolation structure may further provide that the nitride layer is formed also between the fourth oxide layer deposited on an upper portion of the substrate.

In yet another general aspect, there is provided a method for fabricating an isolation structure of a semiconductor device, the method involving: forming a deep trench by etching a substrate a plurality of times; forming a first oxide layer along an inner side of the deep trench and then annealing the first oxide layer; forming a second oxide layer on the first oxide layer and then annealing the second oxide layer; filling a portion of an inside of the deep trench on the second oxide layer with a filler; etching such that upper portions of the first and second oxide layers are recessed downward the deep trench; etching the filler so that the filler exists on only portion of the inside of the deep trench; and forming a fourth oxide layer on the first oxide layer, the second oxide layer and the filler.

The general aspect of the method may further involve forming an undercut structure on a boundary area between an inner sidewall of the deep trench and the first oxide layer.

The general aspect of the method may further provide that 1 the forming the deep trench involves forming a first trench by etching the substrate, and forming a second trench by additionally etching a bottom surface of the first trench.

The general aspect of the method may further provide that each of the first and second oxide layers is deposited to a thickness of 2500 to 5000 Å.

The general aspect of the method may further provide that each of the first and second oxide layers is annealed at 1050 to 1200° C.

The general aspect of the method may further provide that each of the first and second oxide layers is annealed for one to two hours.

The general aspect of the method may further provide that the first trench is formed at a depth of 3 to 7 μm from an upper surface of the substrate.

The general aspect of the method may further provide that an undercut structure is formed on an inner sidewall of the deep trench to a depth that corresponds to the bottom surface of the first trench.

The general aspect of the method may further provide that the deep trench is formed at a depth of 10 to 40 μm from an upper surface of the substrate.

The general aspect of the method may further provide that the forming the first trench involves forming a hard mask pattern by stacking in order of a pad oxide layer, a mask nitride layer and a mask oxide layer on the substrate and patterning a stacked structure; forming the first trench by etching the substrate using the hard mask pattern; and removing a polymer which is generated during the forming of the first trench.

The general aspect of the method may further provide that the forming the second trench involves forming a third oxide layer on the bottom surface and an inner sidewall of the first trench; forming the second trench by etching the third oxide layer formed on the bottom surface of the first trench and a substrate area therebelow; and removing a polymer that is generated during the forming of the second trench.

The general aspect of the method may further involve, after the forming of the second trench, performing a nitride layer recess process to etch the mask nitride layer within the hard mask pattern; wet-etching the mask oxide layer within the hard mask pattern; and performing a sidewall oxidizing process to form a buffer oxide layer for channel blocking ion implantation on an inner sidewall of the deep trench.

The general aspect of the method may further involve performing channel blocking ion implantation using the buffer oxide layer.

The general aspect of the method may further involve planarizing an upper surface of the substrate by chemical mechanical polishing (CMP) after an inside of the deep trench is filled with the filler.

The general aspect of the method may further involve, after the inside of the deep trench is filled with the filler, performing a first CMP to retain a part of the first oxide layer on a upper surface of the substrate; and after the first CMP, wet-etching the first oxide layer remaining on the upper surface of the substrate and a part of a oxide layer remaining on the inner sidewall of the first trench.

The general aspect of the method may further involve, after the fourth oxide layer is formed, performing a second CMP to planarize so that the mask nitride layer on a surface of the substrate is partially etched; and removing the mask nitride layer.

The general aspect of the method may further provide that the etching of the filler involves etching so that an upper surface of the filler exists at a depth of 500 to 3000 Å from the upper surface of the deep trench.

The general aspect of the method may further provided that each of the first and second oxide layers has 65 to 75% of coverage.

Other features and aspects may be apparent from the following detailed description, the drawings, and the claims.

Figure 1:
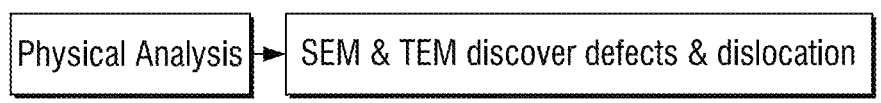
FIG. 1 is a view illustrating a defect of an isolation structure fabricated according to a conventional technique.
Figure 1:
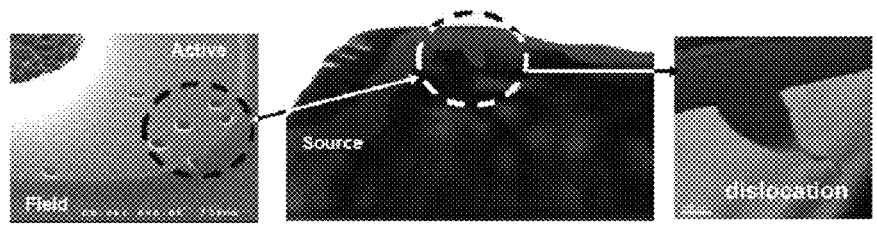

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is understood that the features of the disclosure may be embodied in different forms and should not be constructed as being limited to the examples described above. Rather, the examples are provided so that this disclosure will be thorough and complete, and will convey the full scope of the disclosure to those skilled in the art. The drawings may not be necessarily to scale, and, in some instances, proportions may have been exaggerated in order to clearly illustrate features of the examples. In addition, when a first layer is referred to as being "on" a second layer or "on" a substrate, it may not only refer to a case where the first layer is formed directly on the second layer or the substrate but may also refer to a case where a third layer exists between the first layer and the second layer or the substrate.

According to one general aspect, there is provided an isolation structure in which a substrate has no defect, and the leakage of electronic current is reduced by minimizing the etch damage and physical damage including voids generated during the fabrication. According to other general aspects, there are provided a fabricating method for producing such an isolation structure and a semiconductor device having such an isolation structure.

FIGS. 2A to 2J are cross-section views illustrating an example of a process for fabricating an isolation structure 180 according to a general aspect, which is provided to explain the fabricating method for the above-mentioned isolation structure 180.

According to an embodiment, a substrate 100 is etched to firstly form a first trench 125, and then a bottom surface of the first trench 125 is secondly etched to form a second trench 130 (FIG. 2). The depth of the second trench 130 from the surface of the substrate 100 is greater than the depth of the first trench 125, and the first and second trenches form a deep trench. Since the deep trench is fabricated by two etching processes, etch damage can be reduced. Accordingly, Si crystal effect or dislocation can be reduced on the surface of the substrate as illustrated in FIG. 1.

Next, an oxide layer 140 is formed inside the deep trench, and an isolation structure 180 is formed by filling with the filler 150. Forming an oxide layer 140 may include two processes. That is, the oxide layer 140 may include a first oxide layer 141 which is directly formed on a bottom surface and inner sidewalls inside the trench, and a second oxide layer 142 which is formed on the first oxide layer 141. The first annealing process is carried out after the first oxide layer 141 is formed, and the second annealing process is carried out after the second oxide layer 142 is formed. By the above-explained processes, it is possible to reduce leakage electric current leaking through the isolation structure 180, and also relive the stress which is generated by contraction of the oxide layer 140 in following processes.

Figure 2A:
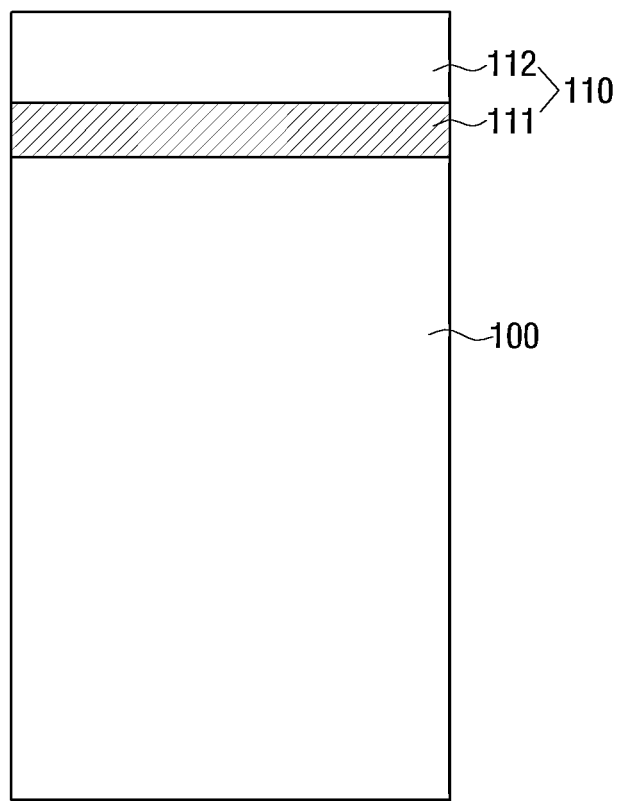
FIGS. 2A to 2J are views illustrating an example of a process of fabricating an isolation structure of a semiconductor device according to a general aspect.
Figure 2B:
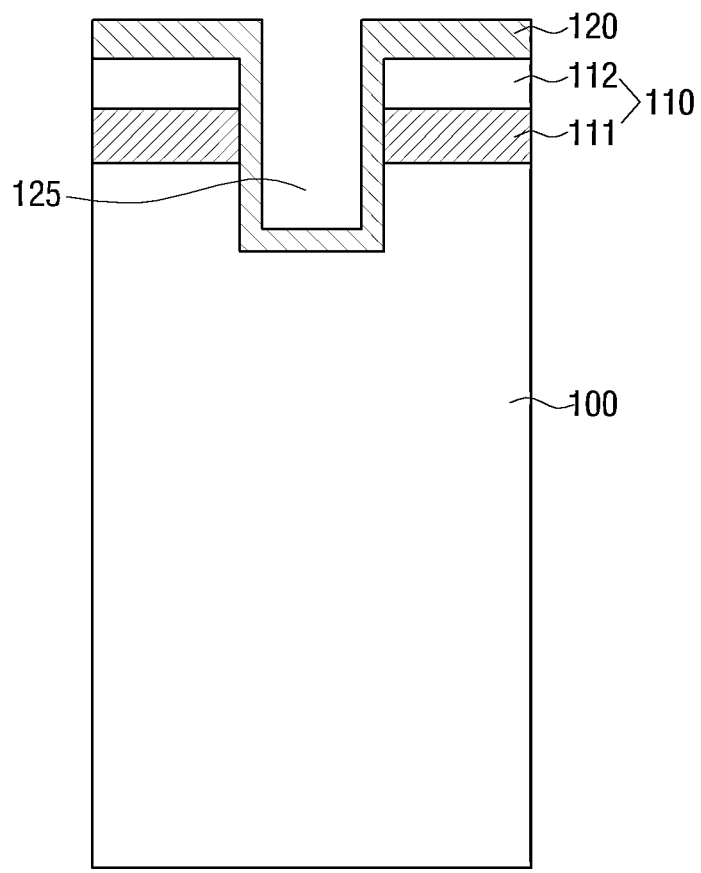

First, FIGS. 2A and 2B are views that explain the processes for forming the first trench 125.

Referring to FIG. 2A, a material layer 110 is formed on the substrate 100. As used herein, the substrate 100 may refer to a general silicon substrate 100, or high-resistivity silicon substrate 100. The material layer 110 (as illustrated in FIG. 2A) herein, for example, refers to a portion that includes a mask nitride layer 111 and a mask oxide layer 112.

For example, a pad oxide layer (not illustrated) may be formed by oxidizing the surface of the substrate 100, and the mask nitride layer 111 may be formed on top of the pad oxide layer. The thickness of the pad oxide layer and the mask nitride layer 111 and the conditions for forming the same may vary depending on the examples. For example, the pad oxide layer may have a thickness between 100 and 300 Å, and the mask nitride layer 111 may have a thickness between 1000 and 2000 Å.

It is possible to form a mask oxide layer 112 on an upper surface of the mask nitride layer 111 after the mask nitride layer 111 is formed. In one general aspect, the mask oxide layer 112 may be realized as a high density plasma (HDP) oxide layer. For example, after the substrate 100 is loaded inside the HDP chamber, a HDP deposition source may be introduced to thus deposit the HDP oxide layer 112 on the surface of the mask nitride layer 111. The 'HDP deposition source' as used herein may include a source gas containing silane ($SiH_4$) gas and oxygen ($O_2$) gas, a carrier gas containing helium, and a reducing gas containing hydrogen. The mask oxide layer 112 may be set to have a thickness approximately ranging between 7000 and 13000 Å.

Accordingly, after the mask oxide layer 112 is formed, a trench pattern is defined by a lithography process that uses a photoresist pattern (not illustrated). Then a hard mask pattern may be formed by removing the mask oxide layer 112 and the mask nitride layer 111 within the defined area. For example, the photoresist may be removed by Asher and piranha cleaning after the mask oxide layer 112 and the mask nitride layer 111 are removed by dry etching.

However, the thicknesses of the respective layers of the hard mask pattern are provided only for illustrative purpose, and should not be limited to any specific numerical figures.

Next, referring to FIG. 2B, the first trench 125 is formed by etching the exposed substrate 100. For convenience of explanation, the etching process for forming the first trench 125 will be hereafter called the first etching process. The first trench 125 may have a depth ranging between 3 and 7 μm. The depth of the first trench 125 may be set to 3 and 7 μm to prevent field concentration from occurring due to undercut structures 101 on both sides of the second trench 130 formed by the second etching process, and also in consideration of the depth of the high voltage junction at the high-voltage device.

Even though FIG. 2B illustrates the first trench 125 in a rectangular shape, the cross-section of the first trench 125 may be a parallelogram having an inclined inner sidewall. Further, in plane view, the first trench 125 that is to form the isolation structure 180 may be formed so as to surround the circuit device to isolated.

After the first etching process, a cleaning process may be performed to clean off any polymer component that is generated during the trench etching.

Next, as illustrated in FIG. 2B, the third oxide layer 120 may be deposited on the front surface of the substrate 100. The third oxide layer 120 may be implemented as a high temperature low pressure deposition (HLD) oxide layer. Hereafter, the third oxide layer 120 is called 'HLD oxide layer'. Accordingly, the HLD oxide layer 120 is formed on the upper portion of the substrate 100, and the inner sidewall and the bottom of the etched first trench 125. The HLD oxide layer 120 may be formed to have a depth ranging between 1000 and 3000 Å. Further, the coverage of the HLD oxide layer 120 may range between 65 and 75%. As used herein, the term 'coverage' refers to the ratio of the thickness of the HLD oxide layer 120 deposited on the surface of the upper portion of the trench, to the thickness of the HLD oxide layer 120 deposited in the interior of the deep trench in a vertical direction.

Figure 2C:
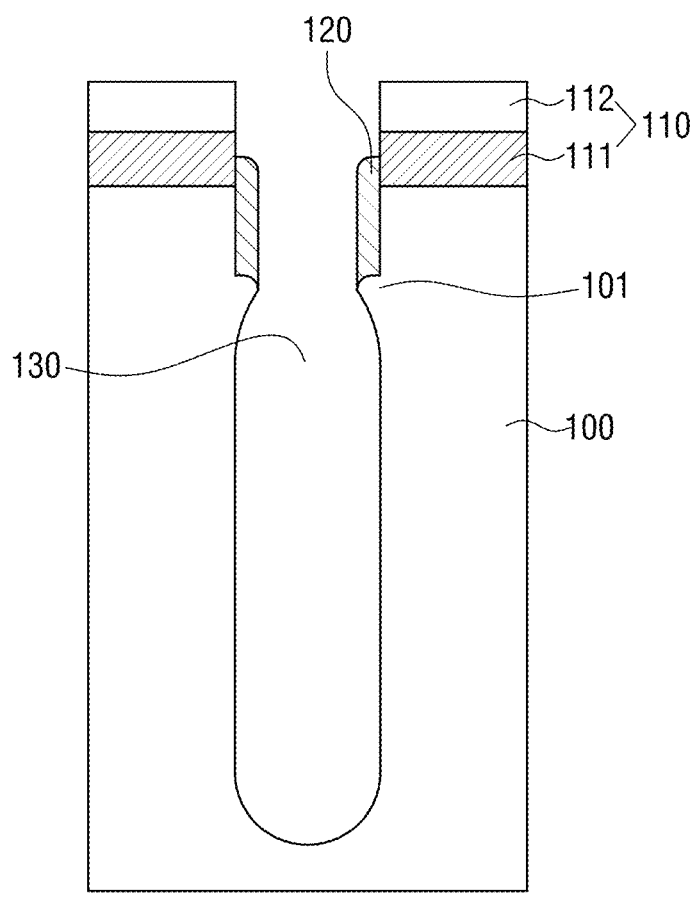

Next, referring to FIG. 2C, the second trench 130 is formed by the second etching process in which the bottom surface of the first trench 125 is additionally etched. Since the second trench 130 is generated by additional etching (i.e., by the second etching process), the depth of the deep trench may range between 10 and 40 μm.

Referring to FIG. 2C, an undercut structure 101 may be formed on some portions of both sidewalls of the deep trench when the second trench 130 is formed. The undercut structure 101 may be formed on both sidewalls of the deep trench to a depth corresponding to the bottom surface of the first trench 125 that is etched by the first etching process. In one general aspect explained above, the undercut structure 101 may be formed at a depth of 3 to 7 μm from the surface of the substrate 100. The undercut structure 101 is alleviated later during the generation of the first and second oxide layers 141, 142 and does not influence the electrical characteristic of the isolation structure 180.

As explained above, by forming a deep trench through a two-step etching process rather than a one-step etching process, less etching damage and stress are inflicted on the isolation structure 180 of a semiconductor device. As a result, the occurrence of physical defects generated during the fabricating process is reduced.

After the second etching process to form the second trench 130, a cleaning process may be carried out to remove polymer components generated during the etching process. The cleaning process may be carried out using sulfuric acid, buffered oxide etchant (BOE), or the like.

After the two etching processes, as illustrated in FIG. 2C, the mask nitride layer 111 and the mask oxide layer 112 remain on the surface of the upper portion of the substrate 100, and a part of the HDL oxide layer 120 formed after the first etching process also remains on the inner sidewall of the first trench 125. Accordingly, an upper portion of the HDL oxide layer 120 may also be etched during the second etching process, leaving the mask nitride layer 111 partially exposed.

As necessary, a pullback process may be carried out to widen a gate of the deep trench by recess etching a portion of the mask nitride layer 111 exposed to the side of the deep trench. By doing so, the generation of voids in the following processes including the deposition of oxide layer and filler 150 may be avoided. It is possible to etch the mask nitride layer 111 using phosphoric acid solution. It is also possible to recess the mask oxide layer 112 in addition to the mask nitride layer 111.

Meanwhile, it will be understood that performing the recess and pullback process depends on practical needs. That is, one may adequately choose between carrying out the pullback process to recess the mask nitride layer 111 and skipping the same.

Next, it is possible to remove the mask oxide layer 112 that is used as the hard mask. The mask oxide layer 112 may be removed by wet etching.

It is then possible to oxidize the sidewalls to form a buffer oxide layer 102 (FIG. 2K) on the inner sidewalls of the deep trench to a thickness ranging between 70 and 150 Å. The buffer oxide layer 102, when generated, works as a buffer layer during the subsequent process of channel blocking ion implantation so that any damage to the inner sidewalls of the deep trench could be prevented during the ion implantation. After the deep trench is formed, the oxide layer 140 is formed by sequentially forming the first and second oxide layers 141, 142. Forming the oxide layer 140 will be further explained below with reference to FIGS. 2D and 2E.

Figure 2D:
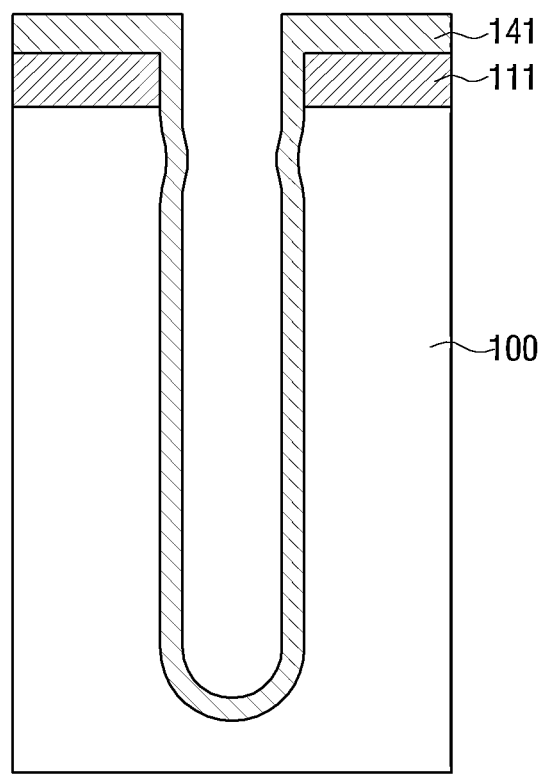

Referring first to FIG. 2D, the first oxide layer 141 is deposited on the substrate 100 and the deep trench. The first oxide layer 141 may be deposited to a thickness ranging between 2500 and 5000 Å. After the first oxide layer 141 is deposited, the first annealing process is performed at 1050 to 1200° C. for 1 to 2 hours. The coverage of the first oxide layer 141 may range between 65 and 75%.

Figure 2E:
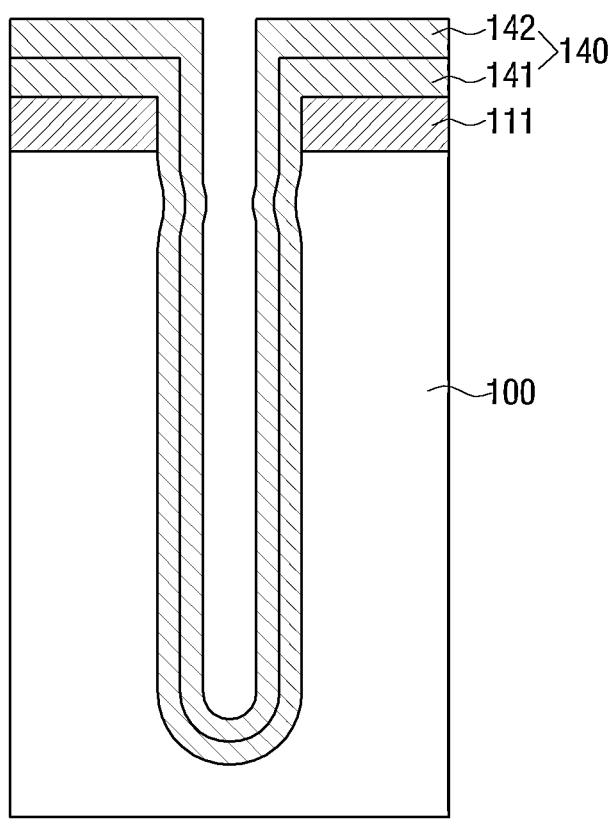

Next, referring to FIG. 2E, the second oxide layer 142 is deposited on the first oxide layer 141. The second oxide layer 142 may be deposited to a thickness ranging between 2500 and 5000 Å. When the second oxide layer 142 is deposited, as in the case of the first oxide layer 141, a second annealing process may be performed at 1050 to 1200° C. for 1 to 2 hours. Also, as in the case of the first oxide layer 141, the coverage of the second oxide layer 142 may be 65 to 75%.

The above-mentioned conditions such as the thickness, annealing temperature and annealing time duration for the first and second oxide layers 141, 142 are set so as to minimize the stress during the two annealing processes. The stress increases during the annealing process if the above conditions are not met, and the occurrence of physical defects in the isolation structure 180 consequentially increases.

Figure 2F:
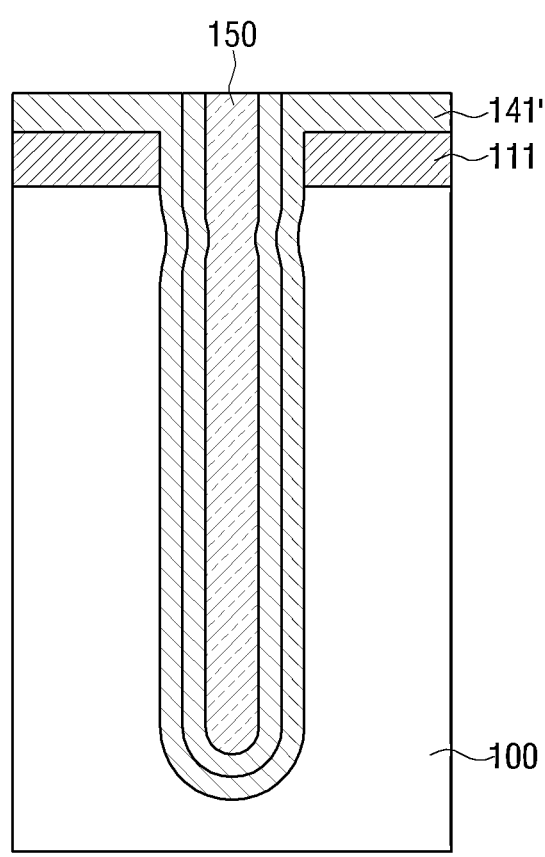
Figure 2G:
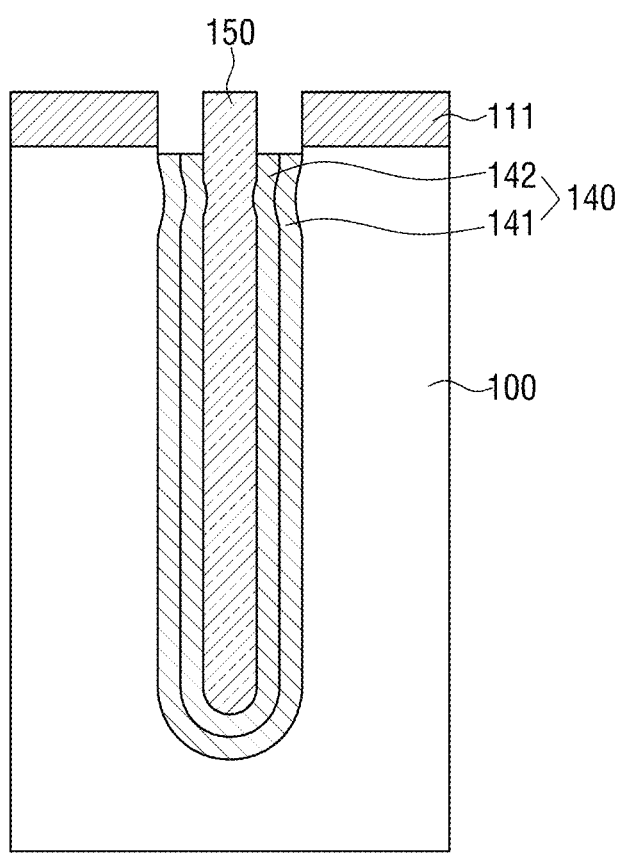

Next, a gap filling process is performed to fill the empty space inside the deep trench with a filler 150. The filler 150 may be gap-filled to a thickness ranging between 6000 and 10000 Å. A polysilicon material may be used as the filler 150. FIG. 2F illustrates a state in which planarization is performed with the inside of the deep trench being gap-filled.

As explained above, according to one general aspect, the deep trench is formed to a predetermined depth, the first oxide layer 141 is deposited, the first annealing is performed, the second oxide layer 142 is deposited, the second annealing is performed, and the inside of the deep trench is gap-filled with the filler 150. Since the isolation structure 180 is fabricated with rationalized processes, the formation of defects on the substrate 100 and the leakage of electric current may be reduced.

For example, in order to reduce the leakage electric current and Si defects, the processes including the oxide layer 140 deposition, annealing and gap-filing of the filler 150 are performed according to the above-mentioned conditions. To be specific, in consideration of the test result for leakage electric current removal and process margin for the fabrication of the products, the filler 150 that is gap-filled in the deep trench may be set to have a thickness at least approximately ranging from 6000 to 10000 Å.

Further, according to an experiment, even when the deep trench is fabricated by two-step etching process, Si defects tend to increase with the increasing thickness of the oxide layer 140 that includes the first and second oxide layers 141, 142. In order to solve this problem, the stress caused by the contraction of the oxide layer 140 in the subsequent processes may be relieved by depositing the first oxide layer 141, performing the first annealing, depositing the second oxide layer 142 on top and performing the second annealing. By forming the first and second oxide layers 141, 142 sequentially, less electric current leaks through the obtained structure.

After the gap-filling process is performed as explained above, the filler 150 is gap-filled in the inside of the deep trench. Planarization is then performed with respect to the deep trench with the filler 150 gap-filled therein.

Hereafter, the process of planarizing an isolation structure 180 according to a general aspect will be explained with reference to FIGS. 2F to 2J.

For example, referring to FIG. 2F, a part of the oxide layer 140 remaining on the upper surface of the substrate 100 is removed by performing the first CMP after the inside of the deep trench is filled with the filler 150. The first CMP is performed in a manner that 500 to 2000 Å of the oxide layer 141' remains.

After the first CMP is completed, the oxide layer 141' remaining on the upper surface of the substrate 100 is wet-etched, to thereby remove the oxide layer 141'. It is possible to remove not only the oxide layer 141' remaining on the mask nitride layer 112, but also an upper portion of the oxide layer 140 on the inner sidewall of the first trench 125. As a result, referring to FIG. 2G, the isolation structure 180 is formed.

Figure 2H:
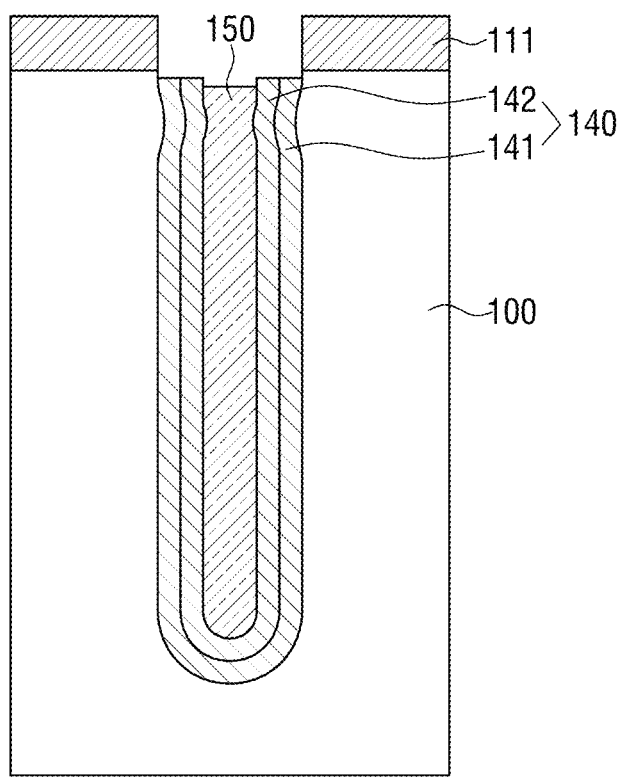

Referring to FIG. 2H, an etch-back process is performed to remove the filler 150 that is gap-filled within the deep trench, i.e., to remove the polysilicon material from the upper surface of the deep trench to a predetermined depth. As used herein, the predetermined depth may preferably be 500 to 3000 Å. If the filler 150 is etch-backed from the upper surface of the deep trench to less than 500 Å, the filler 150 may be exposed during the following etching and cleaning processes, and cause defects in the device. Conversely, if the filler 150 is etch-backed to more than 3000 Å, the coverage characteristic may deteriorate at a later stage, i.e., during the deposition of the fourth oxide layer 160.

Figure 2I:
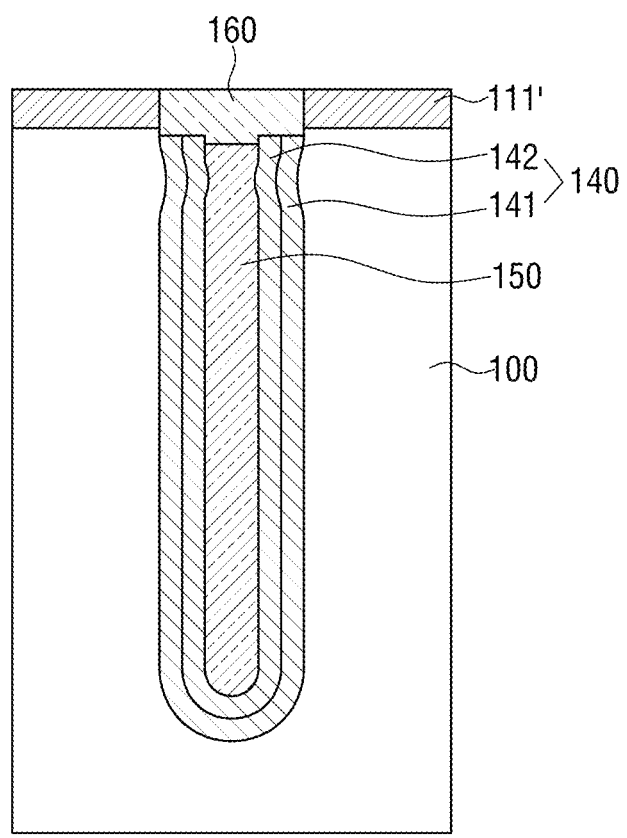

After the filler 150 remaining in the deep trench is oxidized (not illustrated), as illustrated in FIG. 2I, the fourth oxide layer 160 is deposited on the oxidized filler 150 to thereby fill the deep trench. The fourth oxide layer 160 may be a High Density Plasma (HDP) oxide layer. Hereafter, the fourth oxide layer 160 will be referred to as a 'HDP oxide layer'. The HDP oxide layer may fill approximately 4000 to 7000 Å, which is the thickness range that takes the degree of etch-back of the filler 150 into consideration. That is, the above thickness range takes the margins for etch-back into consideration.

Next, the second CMP is performed so that 500 to 800 Å mask nitride layer 111' remains on the surface of the substrate 100. Then by using phosphoric acid and HF, the mask nitride layer 111' is removed.

Figure 2J:
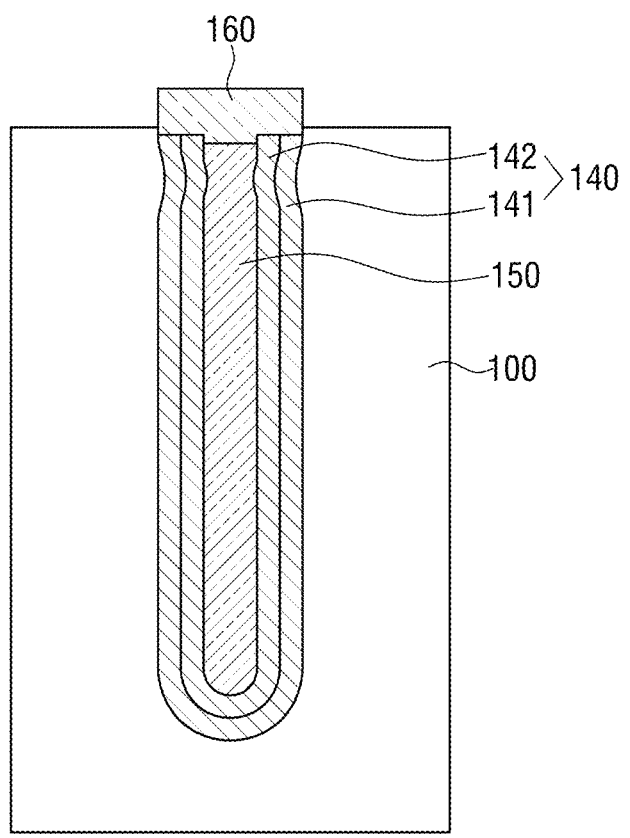
Figure 2K:
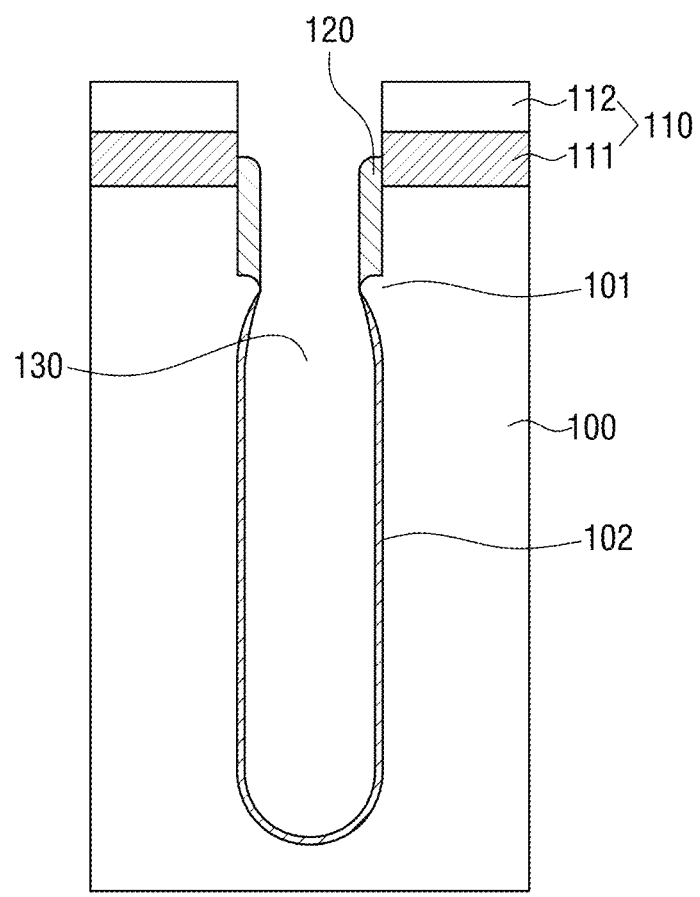
FIG. 2K is a view of a semiconductor device during a process of fabricating an isolation structure according to a general aspect.

As a result, referring to FIG. 2J, as the last remaining portion of the mask nitride layer 111' is removed, an isolation structure 180 of a semiconductor device, from which the mask nitride layer 111 and the mask oxide layer 112 constituting the hard mask are removed, may be formed. Referring to FIG. 2J, the final form of the isolation structure 180 includes a substrate 100, a trench formed on the substrate 100, an oxide layer 140 formed on a bottom surface and inner sidewall of the trench, a filler 150 partially filling the trench, and a fourth oxide layer 160 filling the upper portion of the filler 150 of the trench to a height above the upper surface of the trench. The undercut structure 101 is formed on a boundary between the inner sidewall of the trench and the oxide layer 140.

According to the method for fabricating the isolation structure 180 of the semiconductor device as explained above, a deep trench may be formed using two-step etching processes, the first oxide layer 141 may be formed on the formed trench, the first annealing may be performed, the second oxide layer 142 may be formed, and the second annealing may be performed, in that order. Accordingly, physical defects and stress generated during the process for forming a semiconductor device may be minimized, and the leakage of electric current may be prevented.

The isolation structure 180 may be used to electrically isolate the circuit devices in the semiconductor device. That is, according to one general aspect, the semiconductor device may include a substrate 100, a circuit device formed on the substrate 100, and an isolation structure 180 to isolate the circuit device, and the isolation structure 180 may have an undercut structure 101 on a boundary between the trench and the oxide layer 140 as explained above.

Figure 3:
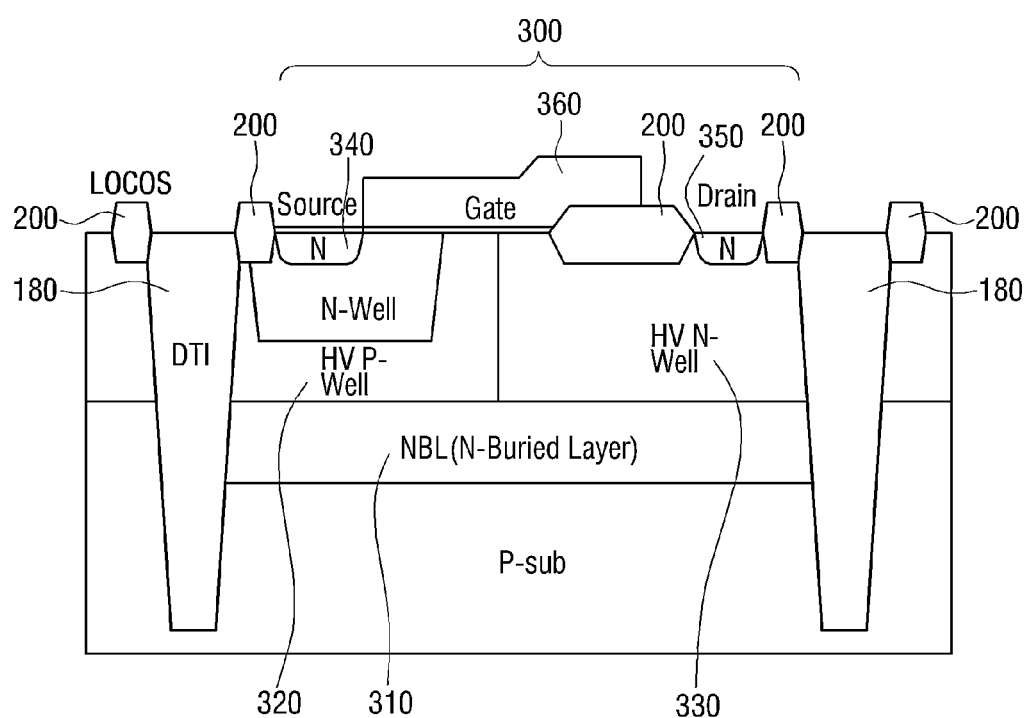
FIG. 3 is a view illustrating an example of a semiconductor device according to a general aspect.

FIG. 3 illustrates an example of a semiconductor device including an isolation structure 180 according to a general aspect.

First, FIG. 3 is a vertical cross-section view of the semiconductor device. Referring to FIG. 3, the semiconductor device includes a circuit region 300, a field region 200 and an isolation structure 180.

The circuit region 300 is where a circuit device is formed. According to the example of a semiconductor device illustrated in FIG. 3, one transistor circuit device is formed in the circuit region 300. The circuit region 300 is electrically isolated in a horizontal direction by an isolation structure 180, and electrically isolated in a vertical direction by a barrier layer (NBL) 310.

In the example, the circuit region 300 includes a barrier layer (NBL) 310 to insulate the circuits. A first well region 320 and a second well region 330 are formed on the barrier layer 310, and the first and second well regions 320, 330 are adjoined with each other. The first well region 320 may be formed as a high density P-type region, and the second well region 330 may be formed as a high density N-type region. That is, the first well region 320 and the second well region 330 include a higher concentration of dopant per unit volume than the respective source region 340 and drain region 350.

A source region 340 may be formed on the first well region 320, and a drain region 350 may be formed on the second well region 330. A gate region 360 may exist on the first and second well regions 320, 330 between the drain region 350 and the source region 340, and may be extended over a field oxide layer 200 that exists between the drain region 350 and the source region 340.

The field oxide layer 200 (or a field region) may be formed to insulate in the circuit region 300. Referring to FIG. 3, the field region 200 may be formed between the isolation structure 180 and the source region 340, between the gate region 360 and the drain region 350, and between the drain region 350 and the isolation region 180. The field oxide layer 200 may be formed by LOCOS.

Referring to FIGS. 2A to 2J, the isolation structure 180 is formed after undergoing two etchings to form a deep trench, two depositions to form an oxide layer 140 and annealing.

However, the semiconductor device illustrated in FIG. 3 is only one example of semiconductor devices according to various general aspects. Accordingly, a semiconductor device containing different types of circuit devices may also be included in other examples according to other general aspects.

Figure 4:
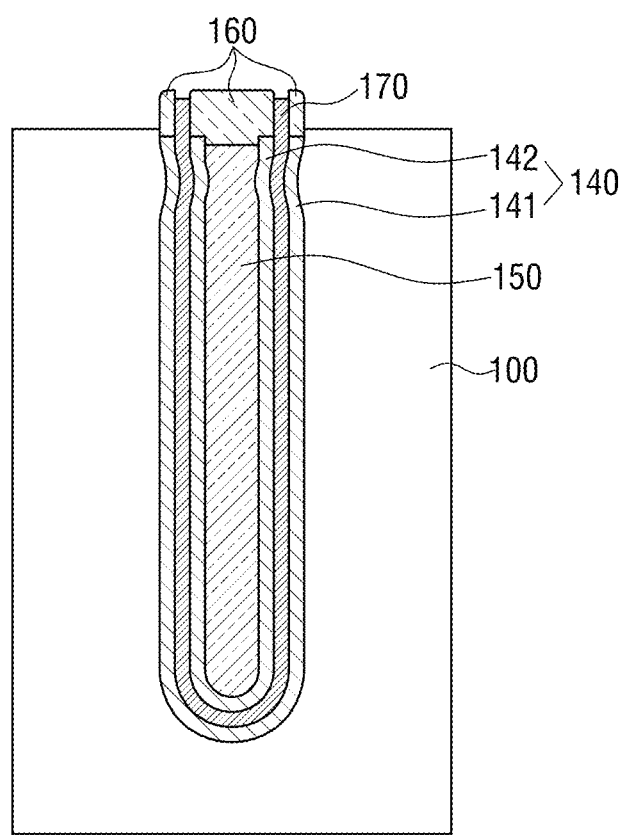
FIGS. 4 and 5 are views illustrating an example of an isolation structure of a semiconductor device according to a general aspect.

FIG. 4 is a view illustrating an isolation structure 180 of a semiconductor device according to another general aspect.

Referring to FIG. 4, the isolation structure 180 of the semiconductor device may include an additional nitride layer 170 formed between the first and second oxide layers 141, 142. The additional nitride layer 170 may be deposited after the first oxide layer 141 of FIG. 2D is deposited and annealed. As illustrated in FIG. 4, the additional nitride layer 170 may be formed also between the fourth oxide layers 160 that are formed on the upper portion of the substrate 100.

Meanwhile, if the field oxide layer 200 that is to be formed at a later stage by the LOCOS on a side of the isolation structure 180 is miss-aligned, causing the active region to be formed on the side of the isolation structure 180, and the thickness of the fourth oxide layer 160 is inappropriate or the deep trench is inappropriately etched back downward, the filler 150 may be exposed, possibly causing a short (short circuit) in the active region. The nitride layer 170 protruding upward from the deep trench may additionally prevent a possibility of having the above-explained problem.

Figure 5:
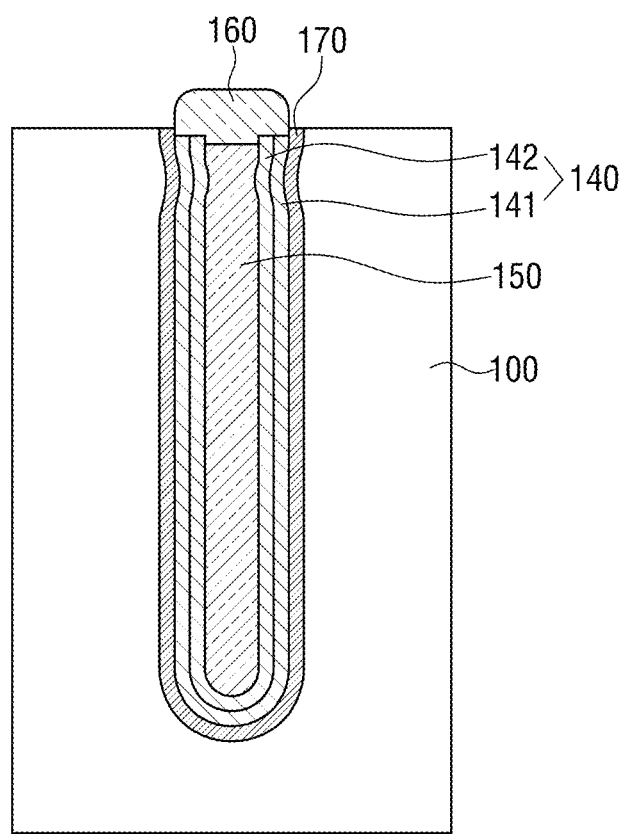

FIG. 5 is a view provided to explain an isolation structure 180 of a semiconductor device according to yet another general aspect. Referring to FIG. 5, the isolation structure 180 of the semiconductor device may include an additional nitride layer 170 provided between an inner sidewall and a bottom surface of the deep trench and the first oxide layer 141. Further, the additional nitride layer 170 may be deposited before the first oxide layer 141 is deposited on the inside of the deep trench that is formed by the two etching as illustrated in FIG. 2C.

Meanwhile, the structure illustrated in FIGS. 4 and 5 has the nitride layer 170 with tensile stress being adjoined with the oxide layer 140 with compressive stress. Accordingly, due to the counteractive stress characteristic which offsets stresses, the isolation efficiency may be further increased. A number of examples have been described above. It will be understood that various modifications may be made to these examples. For example, suitable results may be achieved if the described techniques are performed in a different order and/or if components in a described system, architecture, device, or circuit are combined in a different manner and/or replaced or supplemented by other components or their equivalents. Accordingly, the examples are provided for illustrative purpose only, and other implementations are within the scope of the following claims.

What is claimed is:

1. A method for fabricating an isolation structure of a semiconductor device, the method comprising:
   forming a deep trench by etching a substrate a plurality of times;
   forming a first oxide layer along an inner side of the deep trench and then annealing the first oxide layer;
   forming a second oxide layer on the first oxide layer and then annealing the second oxide layer;
   filling a portion of an inside of the deep trench on the second oxide layer with a filler;
   etching such that upper portions of the first and second oxide layers are recessed downward the deep trench;
   etching the filler so that the filler exists on only part of the inside of the deep trench; and
   forming an additional oxide layer on the first oxide layer, the second oxide layer and the filler.

2. The method of claim 1, comprising forming an undercut structure on a boundary area between an inner sidewall of the deep trench and the first oxide layer.

3. The method of claim 1, wherein the forming the deep trench comprises:
   forming a first trench by etching the substrate; and
   forming a second trench by additionally etching a bottom surface of the first trench.

4. The method of claim 3, wherein the first trench is formed at a depth of 3 to 7 μm from an upper surface of the substrate.

5. The method of claim 3, wherein an undercut structure is formed on an inner sidewall of the deep trench to a depth that corresponds to the bottom surface of the first trench.

6. The method of claim 3, wherein the forming the first trench comprises:
   forming a hard mask pattern by stacking in order of a pad oxide layer, a mask nitride layer and a mask oxide layer on the substrate and patterning a stacked structure;
   forming the first trench by etching the substrate using the hard mask pattern; and
   removing a polymer which is generated during the forming of the first trench.

7. The method of claim 6, wherein the forming the second trench comprises:
   forming a third oxide layer on the bottom surface and an inner sidewall of the first trench;
   forming the second trench by etching the third oxide layer formed on the bottom surface of the first trench and a substrate area therebelow; and
   removing a polymer that is generated during the forming of the second trench.

8. The method of claim 7, further comprising:
   after the forming of the second trench, performing a nitride layer recess process to etch the mask nitride layer within the hard mask pattern;
   wet-etching the mask oxide layer within the hard mask pattern; and
   performing a sidewall oxidizing process to form a buffer oxide layer for channel blocking ion implantation on an inner sidewall of the deep trench.

9. The method of claim 8, further comprising performing channel blocking ion implantation using the buffer oxide layer.

10. The method of claim 9, further comprising planarizing an upper surface of the substrate by chemical mechanical polishing (CMP) after an inside of the deep trench is filled with the filler.

11. The method of claim 9, further comprising:
    after the inside of the deep trench is filled with the filler, performing a first CMP to retain a part of the first oxide layer on a upper surface of the substrate; and
    after the first CMP, wet-etching the first oxide layer remaining on the upper surface of the substrate and a part of a oxide layer remaining on the inner sidewall of the first trench.

12. The method of claim 11, comprising:
    after the additional oxide layer is formed, performing a second CMP to planarize so that the mask nitride layer on a surface of the substrate is partially etched; and
    removing the mask nitride layer.

13. The method of claim 1, wherein each of the first and second oxide layers is deposited to a thickness of 2500 to 5000 Å.

14. The method of claim 13, wherein each of the first and second oxide layers has 65 to 75% of coverage.

15. The method of claim 1, wherein each of the first and second oxide layers is annealed at 1050 to 1200° C.

16. The method of claim 1, wherein each of the first and second oxide layers is annealed for one to two hours.

17. The method of claim 1, wherein the deep trench is formed at a depth of 10 to 40 μm from an upper surface of the substrate.

18. The method of claim 1, wherein the etching of the filler comprises etching so that an upper surface of the filler exists at a depth of 500 to 3000 Å from the upper surface of the deep trench.

19. The method of claim 1, wherein the first oxide layer is annealed before the step of forming the second oxide layer on the first oxide layer, and wherein the second oxide layer is annealed before the step of filling the portion of the inside of the deep trench on the second oxide layer with a filler.

20. The method of claim 1, wherein the filler is etched such that the upper portion of the filler is recessed downward the deep trench beyond the recessed upper portion of the second oxide layer.

21. The method of claim 1, wherein the filler is etched to exist only in contact with the second oxide layer and the additional oxide layer.

22. The method of claim 1, wherein the additional oxide layer is formed directly on each of the first oxide layer, the second oxide layer, and the filler.

23. The method of claim 1, wherein, in the step of etching the filler, the filler exists on only a recessed part of the inside of the deep trench.

* * * * *